US012733383B2

(12) United States Patent
Yang

(10) Patent No.: US 12,733,383 B2
(45) Date of Patent: Sep. 8, 2026

(54) DISPLAY PANEL AND DISPLAY DEVICE

(71) Applicants: Yunnan Invensight Optoelectronics Technology Co., Ltd., Kunming (CN); BOE Technology Group Co., Ltd., Beijing (CN)

(72) Inventor: Zongshun Yang, Beijing (CN)

(73) Assignees: Yunnan Invensight Optoelectronics Technology Co., Ltd., Kunming (CN); BOE Technology Group Co., Ltd., Beijing (CN)

( * ) Notice: Subject to any disclaimer, the term of this patent is extended or adjusted under 35 U.S.C. 154(b) by 370 days.

(21) Appl. No.: 18/556,909

(22) PCT Filed: Jan. 19, 2023

(86) PCT No.: PCT/CN2023/073071

§ 371 (c)(1),
(2) Date: Oct. 24, 2023

(87) PCT Pub. No.: WO2024/152284

PCT Pub. Date: Jul. 25, 2024

(65) Prior Publication Data

US 2024/0268201 A1 Aug. 8, 2024

(51) Int. Cl.
*H10K 59/80* (2023.01)
*H10K 59/122* (2023.01)
*H10K 59/38* (2023.01)

(52) U.S. Cl.
CPC ......... *H10K 59/879* (2023.02); *H10K 59/122* (2023.02); *H10K 59/38* (2023.02); *H10K 59/80521* (2023.02)

(58) Field of Classification Search
CPC .... H10K 59/879; H10K 59/122; H10K 59/38; H10K 59/80521; H10K 59/858; H10K 50/858
See application file for complete search history.

(56) References Cited

U.S. PATENT DOCUMENTS 8,727,579 B2 5/2014 Kim et al.
8,944,616 B2 2/2015 Ichinose et al.
(Continued)

FOREIGN PATENT DOCUMENTS

CN 102460229 A 5/2012
CN 102856349 A 1/2013
(Continued)

*Primary Examiner* — Steven B Gauthier
*Assistant Examiner* — Marc-Anthony Armand
(74) *Attorney, Agent, or Firm* — Westman, Champlin & Koehler, P.A.

(57) ABSTRACT

Provided is a display panel and a display device. The display panel includes a base substrate, a light-emitting layer located on the base substrate, and a first lens layer located on a side of the light-emitting layer. The light-emitting layer is configured to emit light towards the side of the light-emitting layer. The first lens layer includes N lenses for converging the light. Each lens has M layers of lens regions arranged in a stepped shape from bottom to top. Each layer of lens region is arranged along a circumference of the lens within a predetermined angle range. Each layer of lens region has a curvature and the curvatures of the M layers of lens regions gradually increase from bottom to top of the lens, where N and M are greater than or equal to 1.

18 Claims, 9 Drawing Sheets

(56) References Cited

U.S. PATENT DOCUMENTS

| | | | | |
|---|---|---|---|---|
| 9,991,320 | B2 | 6/2018 | Joung et al. | |
| 10,468,468 | B2 | 11/2019 | Joung et al. | |
| 10,768,481 | B2 | 9/2020 | Gao et al. | |
| 11,257,880 | B2 | 2/2022 | Joung et al. | |
| 2012/0106169 | A1 | 5/2012 | Kim et al. | |
| 2013/0002690 | A1 | 1/2013 | Ichinose et al. | |
| 2017/0084875 | A1 | 3/2017 | Joung et al. | |
| 2018/0254307 | A1 | 9/2018 | Joung et al. | |
| 2020/0020755 | A1 | 1/2020 | Joung et al. | |
| 2020/0089058 | A1* | 3/2020 | Gao | G02F 1/133603 |
| 2021/0399264 | A1 | 12/2021 | Ueda et al. | |
| 2022/0131112 | A1* | 4/2022 | Hinata | H10K 59/879 |
| 2022/0238845 | A1* | 7/2022 | Sano | H10K 59/873 |

FOREIGN PATENT DOCUMENTS

| | | | |
|---|---|---|---|
| CN | 108957861 | A | 12/2018 |
| CN | 110265473 | A | 9/2019 |
| CN | 110349513 | A | 10/2019 |
| CN | 210536818 | U | 5/2020 |
| CN | 111725429 | A | 9/2020 |
| CN | 112510073 | A | 3/2021 |
| CN | 112840744 | A | 5/2021 |
| CN | 114843418 | A | 8/2022 |
| CN | 115498004 | A | 12/2022 |
| CN | 115498129 | A | 12/2022 |
| JP | 2012252834 | A | 12/2012 |
| KR | 20050103772 | A | 11/2005 |
| KR | 20090073457 | A | 7/2009 |
| TW | 202226636 | A | 7/2022 |

* cited by examiner 314
d3
γ
3141
d2
β
3142
d1
α
3143
410

DISPLAY PANEL AND DISPLAY DEVICE

CROSS REFERENCE TO RELATED APPLICATION(S)

This application is a Section 371 National Stage Application of International Application No. PCT/CN2023/073071, filed on Jan. 19, 2023, entitled "DISPLAY PANEL AND DISPLAY DEVICE", the content of which is incorporated herein in entirety by reference.

TECHNICAL FIELD

The present disclosure relates to a field of display, and more specifically, to a display panel and a display device.

BACKGROUND

Brightness is an important measurement indicator in evaluating display indicator parameters. In order to achieve higher display brightness, a Lens process is added to a light-emitting device, so as to achieve a purpose of condensing light to increase the brightness. Generally, it is possible to achieve an effect of increasing 1.2 to 1.8 times brightness by adding the Lens process. However, since scattered lights around a pixel sharply converge towards a center of the pixel in the Lens process, a viewing angle will be narrowed accordingly. Therefore, when the brightness of the device is increased through the Lens process, it is often accompanied by a certain loss of the viewing angle.

SUMMARY

In an aspect, embodiments of the present disclosure provide a display panel, including: a base substrate; a light-emitting layer disposed on the base substrate and configured to emit light towards a side of the light-emitting layer in a first direction; and a first lens layer disposed on the base substrate and located on the side of the light-emitting layer in the first direction, where the first lens layer includes N lenses for converging the light. Each lens has M layers of lens regions arranged in a stepped shape from bottom to top. Each layer of lens region is arranged along a circumference of the lens within a predetermined angle range. Each of the M layers of lens regions has a curvature and the curvatures of the M layers of lens regions gradually increase from bottom to top of the lens, where N and M are greater than or equal to 1.

In some embodiments, each of the M layers of lens regions has a height and the heights of the M layers of lens regions gradually increase from bottom to top of the lens.

In some embodiments, each of the M layers of lens regions has a slope and the slopes of the M layers of lens regions gradually decrease from bottom to top of the lens.

In some embodiments, each of the M layers of lens regions has a refractive index and the refractive indexes of the M layers of lens regions gradually decrease from bottom to top of the lens.

In some embodiments, a difference between refractive indexes of every adjacent two of the M layers of lens regions gradually increases from bottom to top of the lens.

In some embodiments, in a case that M is greater than or equal to 2, layers of lens regions within a same angle range are configured to change a light output direction of a part of the light in sequence from bottom to top of the lens.

In some embodiments, the display panel further includes a color film layer located between the light-emitting layer and the first lens layer. The display panel further includes a plurality of filters located in the color film layer. The color film layer includes a plurality of overlapping regions. In at least one overlapping region, an orthographic projection of one of adjacent two filters on the base substrate at least partially overlaps with an orthographic projection of the other one of the adjacent two filters on the base substrate. The display panel further includes a first interval located between two adjacent lenses. An orthographic projection of the first interval on the base substrate at least partially overlaps with an orthographic projection of the at least one overlapping region on the base substrate.

In some embodiments, a width of the first interval is smaller than a height of a bottom layer of lens region in the lens adjacent to the first interval, where the bottom layer of lens region is the lens region farthest away from a light output side of the lens.

In some embodiments, the plurality of overlapping regions include a first overlapping region, a first filter has a first slope in the first overlapping region, and the first slope is a slope from a highest point of the first filter in the first overlapping region to an edge of the first filter. A slope of a bottom one of the M layers of lens regions is greater than the first slope. The bottom layer of lens region is the lens region farthest away from a light output side of the lens.

In some embodiments, a slope of a sub bottom one of the M layers of lens regions is greater than the first slope. The sub bottom layer of lens region is adjacent to the bottom layer of lens region. The slope of the sub bottom layer of lens region is less than the slope of the bottom layer of lens region.

In some embodiments, the first filter has a second slope in the first overlapping region. The second slope is a slope from the highest point of the first filter to a center of the first filter. A slope of each of the M layers of lens regions is greater than the second slope.

In some embodiments, the first slope is greater than the second slope.

In some embodiments, a top of a top one of the M layers of lens regions includes an arc-shaped surface protruding along the first direction, and the top layer of lens region is the lens region closest to a light output side of the lens.

In some embodiments, a projection of at least one of the M layers of lens regions on a first plane includes a line segment, and the first plane is parallel to the first direction.

In some embodiments, a width of the each lens in a second direction decreases from bottom to top of the lens, and the second direction is perpendicular to the first direction.

In some embodiments, for any adjacent two of the M layers of lens regions, in the second direction, a difference between a width of an upper one of the two layers of lens regions and a width of a lower one of the two layers of lens region on a single side of the lens is less than a width of an interval between the lens and an adjacent lens.

In some embodiments, the each lens includes a micro lens. The N lenses are configured to form a micro lens array; and/or the display panel includes a micro-display panel.

In some embodiments, the display panel further includes: an anode disposed on the base substrate, where the anode is located on a side of the light-emitting layer close to the base substrate, a pixel defining layer disposed on the base substrate, where the pixel defining layer is located between the anode and the light-emitting layer; and a cathode disposed on the base substrate, where the cathode is located on a side of the light-emitting layer away from the base substrate. The cathode includes a first cathode portion and a second cathode portion. An orthographic projection of the first cathode portion on the base substrate falls within an orthographic projection of the anode on the base substrate. The second cathode portion protrudes towards the first direction relative to the first cathode portion. The pixel defining layer includes a first side edge and a second side edge. An orthographic projection of the first side edge on the base substrate and an orthographic projection of the second side edge on the base substrate both fall within an orthographic projection of an anode of a same sub-pixel on the base substrate. The cathode includes a first protrusion edge and a second protrusion edge. The first protrusion edge and the second protrusion edge are located in a transition region between the first cathode portion and the second cathode portion. An orthographic projection of the first protrusion edge on the base substrate and an orthographic projection of the second protrusion edge on the base substrate both fall within an orthographic projection of an anode of a same sub-pixel on the base substrate. A conical region is defined by a first line between the first side edge and the first protrusion edge, and a second line between the second side edge and the second protrusion edge.

In some embodiments, an orthographic projection of the conical region on the base substrate at least partially overlaps with an orthographic projection of a top layer of lens region on the base substrate, and the top layer of lens region is a lens region closest to a light output side of the lens.

In some embodiments, each of the M layers of lens regions has a projection length and the projection lengths of the M layers of lens regions gradually increase from bottom to top of the lens. The projection length is a length of a side edge of each layer of lens region in a first plane. The side edge extends from bottom to top of the layer of lens region. The first plane is parallel to the first direction.

In another aspect, embodiments of the present disclosure provide a display device including the display panel as described above.

BRIEF DESCRIPTION OF THE DRAWINGS

Through the following description of embodiments of the present disclosure with reference to the accompanying drawings, the above contents, other purposes, features and advantages of the present disclosure will be clearer, in which:

FIG. 9(*b*) schematically shows a physical structure of a lens according to another embodiment of the present disclosure;

FIG. 9(*c*) schematically shows a conical region defined in the physical structure of the lens in FIG. 9(*b*) according to the embodiment of the present disclosure.

It should be noted that for the sake of clarity, in the accompanying drawings used to describe the embodiments of the present disclosure, a size of an overall/local structure or an overall/local region may be enlarged or reduced, that is, these drawings are not drawn according to actual proportions.

DETAILED DESCRIPTION OF EMBODIMENTS

Embodiments of the present disclosure will be described below with reference to accompanying drawings. However, it should be understood that these descriptions are only illustrative and not intended to limit the scope of the present disclosure. In the following detailed description, for ease of explanation, many specific details are elaborated to provide a comprehensive understanding of embodiments of the present disclosure. However, it is clear that one or more embodiments may also be implemented without these specific details. In addition, in the following explanation, descriptions of well-known structures and techniques are omitted to avoid unnecessary confusion with concepts of the present disclosure.

The terms used herein are only intended to describe specific embodiments and are not intended to limit the present disclosure. The terms "comprise", "include", "contain", etc. used herein indicate the existence of the described features, steps, operations, and/or components, but do not exclude the existence or addition of one or more other features, steps, operations, or components.

All terms (including technical and scientific terms) used herein have meanings generally understood by those skilled in the art, unless otherwise defined. It should be noted that the terms used here should be interpreted as having the meaning consistent with the context of this specification, and should not be interpreted in an idealized or too rigid way.

In a case of using an expression similar to "at least one selected from A, B, or C", it should generally be interpreted in accordance with the meaning of the expression generally understood by those skilled in the art (for example, "a system having at least one selected from A, B, or C" should include, but not be limited to, a system having A alone, a system having B alone, a system having C alone, a system having A and B, a system having A and C, a system having B and C, and/or a system having A, B, and C, etc.).

Figure 1:
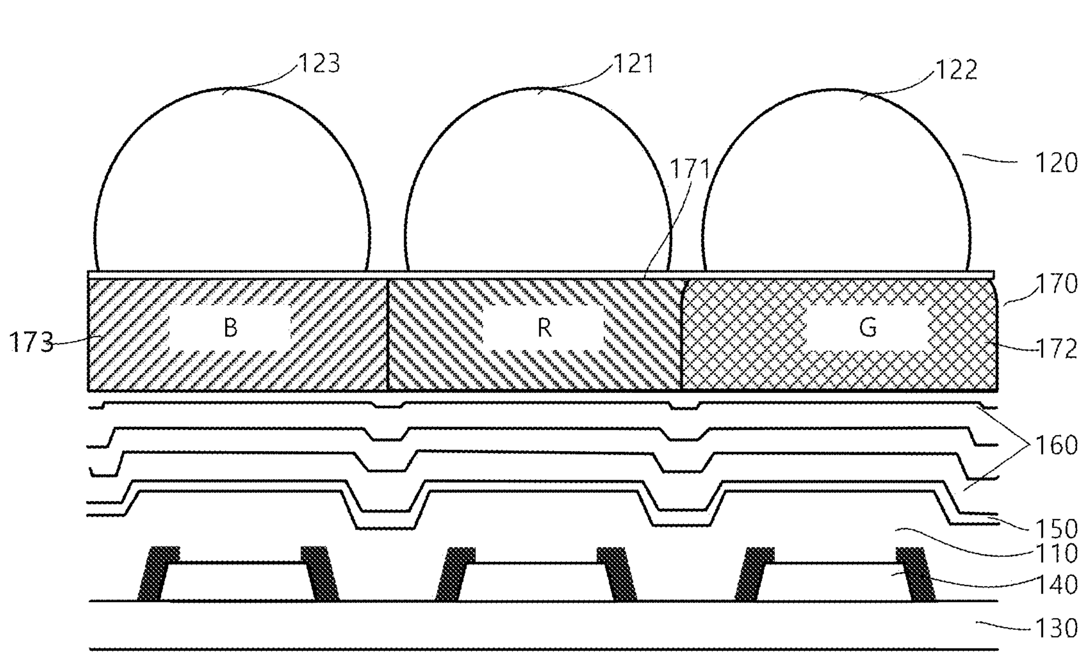
FIG. 1 schematically shows a structural diagram of a display panel in related art.
Figure 2:
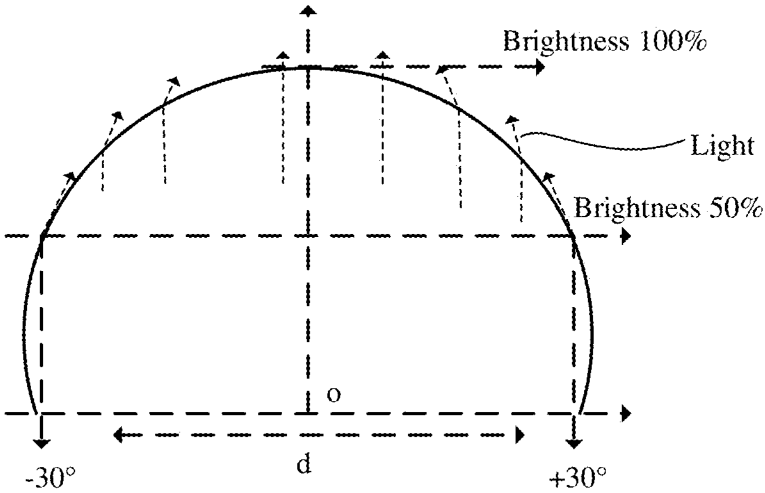
FIG. 2 schematically shows a schematic diagram of light outputting of the lens structure in FIG. 1.

FIG. 1 schematically shows a structural diagram of a display panel in related art. FIG. 2 schematically shows a schematic diagram of light outputting of the lens structure in FIG. 1.

As shown in FIG. 1, a display panel 100 in related art may include an EL light-emitting layer 110, a second lens layer 120, a base substrate 130, an anode layer 140, a cathode layer 150, an encapsulation layer 160, and a color film layer 170. The anode layer 140 provides holes, and the cathode layer 150 provides electrons. The holes and the electrons in the EL light-emitting layer 110 are combined to form excitons, and the excitons excite the EL light-emitting layer 110 to emit light, so as to form a basic light-emitting structure. In some embodiments, the base substrate 130 may be made of single crystal silicon wafer (Wafer).

In some embodiments, a composition structure of a main material of the color film layer 170 (CF color film layer) includes a glass substrate, a black matrix BM, a color layer RGB, a protective layer OC, an ITO conductive film, and a columnar spacer, etc. For different display modes, the composition structure of the CF color film layer may be varied slightly.

For example, the color layer RGB may be arranged in striped arrangement, dotted arrangement, triangular arrangement, mosaic arrangement, or other specific pattern arrangements (such as similar portrait or animal pattern). The striped arrangement and the dotted arrangement are generally used for large-sized and high-precision products. The triangular arrangement and the mosaic arrangement are generally used for small-sized and low-precision products. Chromaticity and transmittance are two major optical characteristics of the CF color film layer, mainly depending on a material of the RGB color layer.

With reference to FIG. 1, each group of lenses may include a lens A 121, a lens B 122, and a lens C 123. Such three lenses correspond to respective filter in a group of red (R) filter 171, green (G) filter 172 and blue (B) filter 173 (which are filled by different patterns in the figure) in the color layer RGB. For example, the EL light-emitting layer 110 emits white light and the white light passes through filters of different colors so that the display panel 100 renders different colors. Based on a correspondence relationship between the lens and the filter, the second lens layer 120 may include a plurality of lenses. The arrangement of the plurality of lenses is in consistent with the arrangement of the color layer RGB, such as striped arrangement, dotted arrangement, triangular arrangement or mosaic arrangement, etc.

With reference to FIG. 1 and FIG. 2, the lens structure in the related art has a function of converging scattered lights from the periphery to the top as a whole, so that a range of brightness changing is large. Moreover, since scattered lights around a pixel are sharply converged towards a center of the pixel, viewing angle will be narrowed accordingly, and a specific brightness range (about 50% brightness as an example) as shown in FIG. 2 is relatively narrow. Therefore, increasing brightness by using the lens is often accompanied by a certain loss of viewing angle.

The present disclosure provides a display panel and a display device in which the brightness viewing angle range is increased.

Figures 3, 4A:
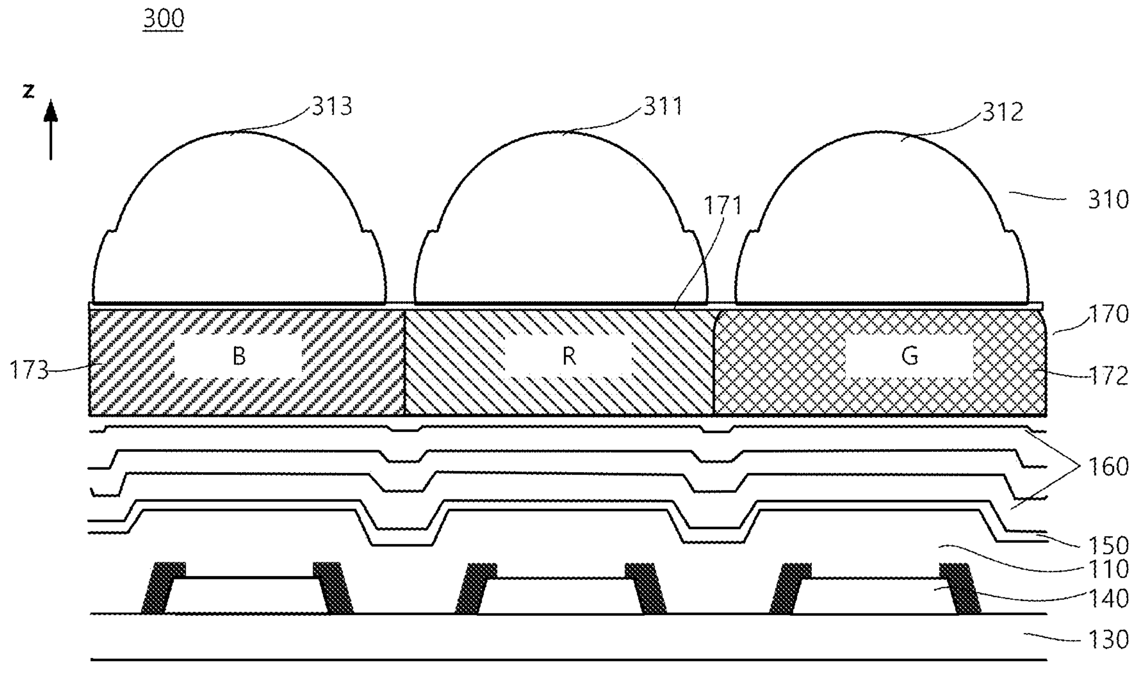
FIG. 3 schematically shows a structural diagram of a display panel according to an embodiment of the present disclosure.

FIG. 3 schematically shows a structural diagram of a display panel according to an embodiment of the present disclosure.

As shown in FIG. 3, a display panel 300 of such embodiment includes an EL light-emitting layer 110, a first lens layer 310, a base substrate 130, an anode layer 140, a cathode layer 150, an encapsulation layer 160 and a color film layer 170. The light-emitting layer 110 is disposed on the base substrate 130 and configured to emit light towards a side of the light-emitting layer in a first direction (as shown in z direction in FIG. 3). The first lens layer 310 is disposed on the base substrate 130 and located on the side of the EL light-emitting layer 110 in the first direction. The first lens layer 310 includes N lenses for converging the light, where each lens has M layers of lens regions arranged in a stepped shape from bottom to top. Each layer of lens region is arranged along a circumference of the lens within a predetermined angle range. Each of the M layers of lens regions has a curvature and the curvatures of the M layers of lens regions gradually increase from bottom to top of the lens, where N and M are greater than or equal to 1.

It should be noted that the gradual increase in curvature as described above is not limited to an equal difference increase. In other words, it means that among the M layers of lens regions, any one layer of lens regions has a curvature being greater than a curvature of another layer of lens region which is closer to the bottom of the lens than said one layer of lens regions.

According to embodiments of the present disclosure, on the one hand, scattered lights around the pixel may be converged by the lens having M layers of lens regions, and light efficiency and increase brightness may be improved. On the other hand, the lens may act as a buffer for the sharp convergence of lights towards the center in each layer of the lens region, thereby increasing an amplification brightness of the device while taking into account the performance of viewing angle of the product. On yet another hand, since the curvatures of the M layers of lens regions gradually increase from bottom to top of the lens, the lens may have a certain height and a brightness region on the top of the lens is larger, so that the lens may have a larger brightness viewing angle.

In some embodiments, except for the first lens layer 310, other structures of the display panel 300 may be the same as or different from those of the display panel 100. Specifically, embodiments of the present disclosure are not intended to limit the base substrate 130 to be made of a single crystal silicon wafer (Wafer). Other structures may be flexibly selected as long as the first lens layer 310 may increase the brightness and brightness viewing angle range.

In some embodiments, each group of lenses may include a lens A' 311, a lens B' 312 and a lens C' 313. As shown in FIG. 3, each lens bounded by a step includes two layers of lens regions. Such three lenses correspond to respective filter in a group of red (R) filter 171, green (G) filters 172 and blue (B) filter 173 in the color layer RGB. In other embodiments, each group of lenses may include a lens corresponding to a group of red (R) filter 171, green (G) filter 172 and blue (B) filter 173. It should be noted that the above terms for each group of lenses and a group of filters are only provided for the purpose of easy understanding and clear description. In a process of manufacturing a display panel or allowing the display panel to emit light, each group of lenses and a group of filters may be configured as independent structural units. However, it does not mean that each group of lenses and a group of filters must be configured as independent structural units, such as each lens and/or each filter are/is configured separately.

In some embodiments, each lens includes a micro lens. N lenses are configured to form a micro lens array, and/or the display panel 300 may be a micro-display panel.

For example, the display panel 300 may be implemented by Micro-OLED micro display device technology, so as to obtain a micro display device that simultaneously achieves high resolution and tiny size. The display panel 300 may be applied to a AR/VR display device such as a helmet mounted display, a stereoscopic display and a glasses-type display. It may also be used in near-eye devices that replace the optical structure by a digital display, such as an electronic telescope, an electron microscope, a medical endoscope and other professional devices with requirements of similar near-eye display.

For example, Micro Lens Panel (MLP) technology includes the manufacturing of micro lenses by photolithography on EL (EL light-emitting layer 110) of each sub-pixel of OLED. By introducing material with high refractive index, the light emitted by the EL is directly refracted at an interface of the lens, thereby achieving focus of light. By utilizing the characteristics of light condensing of micro lenses, the display panel is brightened to maintain higher brightness under the same power consumption.

For example, the micro lens array may be implemented as an array with pixel-level pattern, e.g. arranged in a striped arrangement, a dotted arrangement, a triangular arrangement, a mosaic arrangement or other specific pattern arrangements as described above, so as to increase a forward light output of the display panel.

Figure 4B:
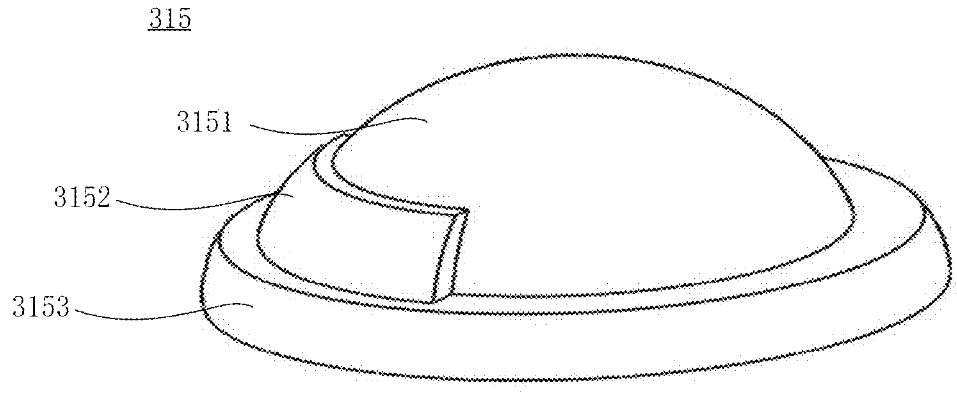
FIG. 4(*a*) to FIG. 4(*c*) schematically show each layer of lens region within a predetermined angle range according to an embodiment of the present disclosure.
Figure 4C:
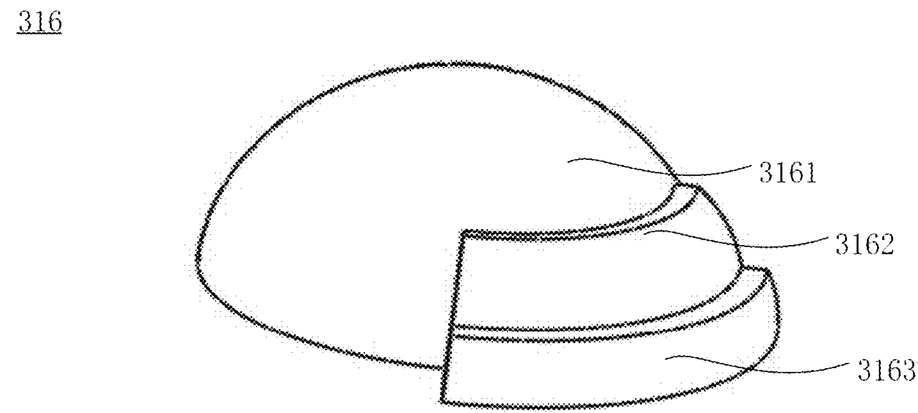

FIG. 4(*a*) to FIG. 4(*c*) schematically show respective layers of lens regions within a predetermined angle range according to an embodiment of the present disclosure.

For example, the predetermined angle range includes a sector or a circle within a range of 0° to 360° obtained by connecting a centerline of the lens to two ends of an arc. The arc is an arc of each layer of lens region along a circumference of the lens.

As shown in FIG. 4(*a*), lens D 314 is provided with three layers of lens regions from bottom to top (such as a first layer of lens region 3141, a second layer of lens region 3142 and a third layer of lens region 3143). Each layer of lens region is disposed along the circumference of the lens within an angle range of 360°.

As shown in FIG. 4(*b*), lens E 315 is provided with three layers of lens regions from bottom to top (such as a first layer of lens region 3151, a second layer of lens region 3152 and a third layer of lens region 3153). The first layer of lens region 3151 and the third layer of lens region 3153 are disposed along the circumference of the lens within an angle range of 360°. The second layer of lens region 3152 is disposed along the circumference of the lens within a range of 0° to 90° (for example only).

As shown in FIG. 4(*c*), lens E 316 is provided with three layers of lens regions from bottom to top (such as a first layer of lens region 3161, a second layer of lens region 3162 and a third layer of lens region 3163). The first layer of lens region 3161 is disposed along the circumference of the lens within an angle range of 360°. The second layer of lens region 3162 and the third layer of lens region 3163 are disposed along the circumference of the lens within a range of 90° to 180° (for example only), both of them being within the same angle range.

With reference to FIG. 3 and FIG. 4(*a*) to FIG. 4(*c*), two layers of lens regions may be disposed along the circumference of each lens within 360° as shown in FIG. 3. Three layers of lens regions may be disposed as shown in FIG. 4(*a*) to FIG. 4(*c*). It should be noted that more layers of lens regions may be disposed as desired in practice.

In some embodiments, an angle range of one layer of lens region in each lens may be different from an angle range of any one of other layers of lens regions. In other embodiments, an angle range of one layer of lens region in each lens may be the same as an angle range of any one of other layers of lens regions.

In some embodiments, three layers of lens regions in different angle ranges may be disposed from bottom to top of the lens. For example, the first layer of lens region is disposed along the circumference of the lens within 360°. The second layer of lens region is disposed along the circumference of the lens within an angle range of 180° to 270° (for example only). The third layer of lens region is disposed along the circumference of the lens within an angle range of 0° to 90° (for example only).

In some embodiments, the N lenses having M layers of lens regions may implemented to be identical, for example, all of them are implemented as lens D 314. In other embodiments, at least one of the N lenses having M layers of lens regions may be different from any other lens(es), e.g. some of the N lenses is(are) implemented as lens D 314 and some of them is(are) implemented as lens E 315.

In some embodiments, each of the M layers of lens regions has a height and the heights of the M layers of lens regions gradually increase from bottom to top of the lens. With reference to FIG. 4(*a*), a height of the first layer of lens region 3141 of lens D 314 is d1. A height of the second layer of lens region 3142 is d2. A height of the third layer of lens region 3143 is d3. A relationship between the heights of layers is d1<d2<d3, that is, the height of the lens region closer to the top light output side of the lens is larger. It is beneficial to gradually increase the viewing angle of a brightness position corresponding to each layer of lens region, especially the top brightness region is larger, so that the brightness and viewing angle range are improved.

It should be noted that the gradual increase in height as described above is not limited to an equal difference increase. In other words, it means that among the M layers of lens regions, any one layer of lens regions has a height being greater than a height of another layer of lens region which is closer to the bottom of the lens than said one layer of lens regions.

In some embodiments, each of the M layers of lens regions has a slope and the slopes of the M layers of lens regions gradually decrease from bottom to top of the lens. With reference to FIG. 4(*a*), an inclined angle of the first layer of lens region 3141 of lens D 314 is $\alpha$. An inclined angle of the second layer of lens region 3142 is $\beta$. An inclined angle of the third layer of lens region 3143 is $\gamma$. A relationship between inclined angles of layers is $\alpha>\beta>\gamma$, that is, the inclined angle of the lens region closer to the top light output side of the lens is smaller. In other words, the slopes of the M layers of lens regions gradually decrease. Larger $\alpha$ and $\beta$ may cause the Lens to have a certain height, such as the height of the Lens >1.0 U. The higher the height, the greater the gain. For example, 1.1 U to 1.8 U matches with a gain of 1.3 to 1.7 times. Smaller angle $\gamma$ ensures a larger brightness region at the top of the lens and a larger brightness viewing angle.

For example, a circumferential surface of each layer of lens region may be curved or planar. By taking the first layer of lens region 3141 as an example, when an outer surface of the first layer of lens region 3141 is curved, a projection of a side of the first layer of lens region 3141 is an arc. The arc extends from bottom to top of the first layer of lens region 3141. The inclined angle $\alpha$ is an angle formed by a tangent at the bottom of the arc and the bottom of the lens region. The inclined angles of other layers of lens regions may be calculated in the same manner as mentioned above, which will not be repeated here.

It should be noted that the gradual decrease in slop as described above is not limited to an equal difference decrease. In other words, it means that among the M layers of lens regions, any one layer of lens regions has a slope being smaller than a slope of another layer of lens region which is closer to the bottom of the lens than said one layer of lens regions.

For example, each of the M layers of lens regions has a curvature and the curvatures of the M layers of lens regions gradually increase from bottom to top of the lens, while the slopes of the M layers of lens regions gradually decrease, so that an entire morphology of the lens is in a semicircular shape, thereby improving light-converging effect and light-transmitting effect.

In some embodiments, each of the M layers of lens regions has a refractive index and the refractive indexes of the M layers of lens regions gradually decrease from bottom to top of the lens. With reference to FIG. 4(*a*), a refractive index of the first layer of lens region 3141 of lens D 314 is e. A refractive index of the second layer of lens region 3142 is f. A refractive index of the third layer of lens region 3143 is g. A relationship between refractive indexes of layers is e>f>g, that is, a lens region closer to the top output side of the lens has a smaller refractive index. The effects achieved include: convergence effects of edge stray light gradually increase from bottom to top, and an entire brightness gain of the center of the lens is increased. Since the refractive index of g is small, it is possible to ensure a certain brightness viewing angle range.

It should be noted that the gradual decrease in refractive index as described above is not limited to an equal difference decrease. In other words, it means that among the M layers of lens regions, any one layer of lens regions has a refractive index being smaller than a refractive index of another layer of lens region which is closer to the bottom of the lens than said one layer of lens regions.

In some embodiments, a difference between refractive indexes of every adjacent two of the M layers of lens regions gradually increases from bottom to top of the lens (for example, the difference increases in other sequences such as arithmetic sequence, geometric sequence or irregular sequence). That is, e-f is smaller than f-g. The closer to the light output side of the lens, the greater is the difference in refractive index between adjacent two layers of lenses. This is beneficial to converge light and increase brightness.

It may be understood that the layers of lens regions of each lens may satisfy one or more of the above relationships in terms of curvature, height, slope, and refractive index. For example, the layers of lens regions of the lens may have the characteristics of gradually decreasing curvature and gradually increasing height, such that the effect in luminosity enhancement and luminosity angle enhancement is improved due to a combination of curvature and height. For example, the layers of lens regions of the lens may have only the characteristic of gradually decreasing refractive index. This may be flexibly adjusted as desired in practice.

Figure 5:
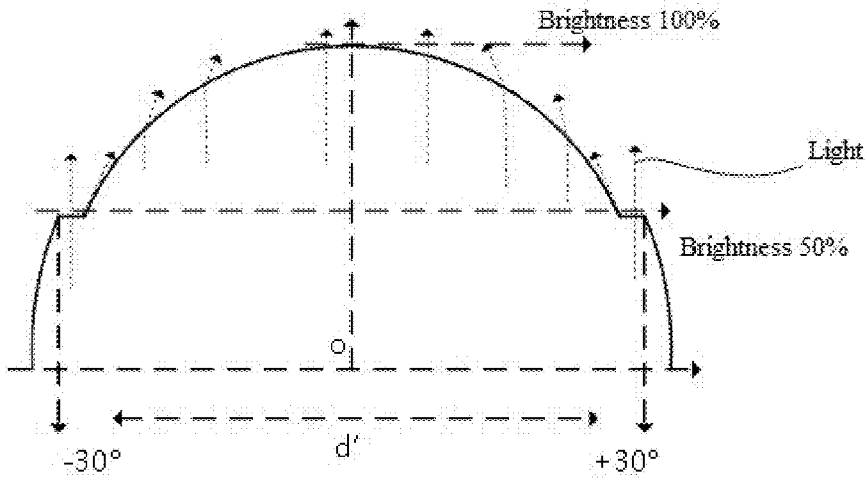
FIG. 5 schematically shows a schematic diagram of a light output of the lens structure in FIG. 3 according to an embodiment of the present disclosure.
Figure 6:
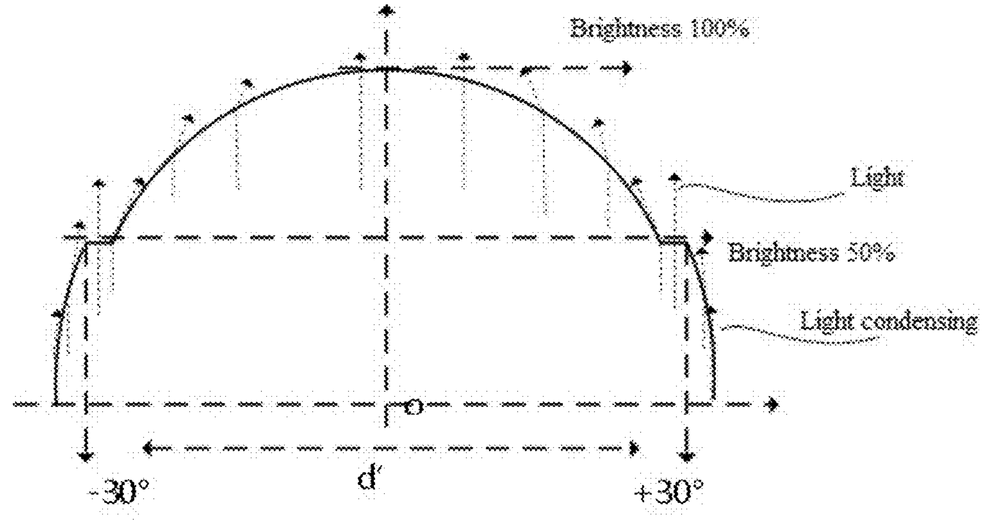
FIG. 6 schematically shows a schematic diagram of light outputting and light condensing of the lens structure in FIG. 3 according to an embodiment of the present disclosure.

FIG. 5 schematically shows a schematic diagram of light outputting of the lens structure in FIG. 3 according to an embodiment of the present disclosure. FIG. 6 schematically shows a schematic diagram of light outputting and light condensing of the lens structure in FIG. 3 according to an embodiment of the present disclosure.

In some embodiments, each layer of lens region is configured to change a light output direction of a part of the light within a predetermined angle range.

With reference to FIG. 5 and FIG. 6, an entire region from periphery to top of the stepped lens structure has a function of converging scattered lights around the stepped lens structure. Due to the least two layers of lens regions, the curved design from top to bottom of the lens in the related art is changed, so that when some light passes through respective layers of lens area (such as the top of each layer of lens area), its outgoing direction no longer sharply converges towards the center along the curved surface and thus the light outputting buffered, reducing the sharpness of light convergence towards the center of the lens, and to some extent widening the brightness range.

In some embodiments, a diameter d' of a region at about 50% brightness as shown in FIG. 5 and FIG. 6 is greater than a diameter d of a region at about 50% brightness shown in FIG. 2. More scattered lights around the lens may be converged, so that the brightness is further increased and the corresponding brightness viewing angle is larger.

In some embodiments, each layer of lens region is configured to change the brightness viewing angle at a brightness position corresponding to a height of the top of each layer of lens region. The height of the top of each layer of lens region includes a distance between each layer of lens region and the bottom of the lens.

For example, when brightness in two viewing directions on a same plane are respectively half of a brightness in a normal direction of the display panel, an angle formed by such two viewing directions in the normal direction of the display panel is referred to as a viewing angle.

For example, a position with a height ratio of about 0.84 between the upper and lower layers is a position where the brightness is about 50% of the maximum brightness. Since the light output direction at the position of 50% brightness is changed (the light output directions of the lens regions are more divergent compared to FIG. 2), a wider brightness viewing angle may be provided at such position. In other words, based on the lens structure in the related art shown in FIG. 2, the lens areas of the lens may be formed by customizing the brightness position required to widen the predetermined angle range of the lens, thereby widening the brightness range and increasing the viewing angle range of products.

According to embodiments of the present disclosure, a segmented lens is designed in a stepped shape, and a coverage area of at least one layer of the lens region is greater than a coverage area of an original circular LENS in the related art at the same position. That is, the lens in this embodiment has a larger overlay on the pixel (such as an orthographic projection of the lens on the pixel), so as to converge more stray lights at the edge of the pixel, further improve the brightness, and increase the brightness viewing angle.

It should be noted that the selective controlling and widening of the intermediate brightness value range are not limited to ~50% brightness position. When a different brightness gradient is desired by the product definition or customer demand, one or more corresponding segmented positions (i.e. the position of the top of each layer of lens region) may be set as desired in practice.

Figure 7:
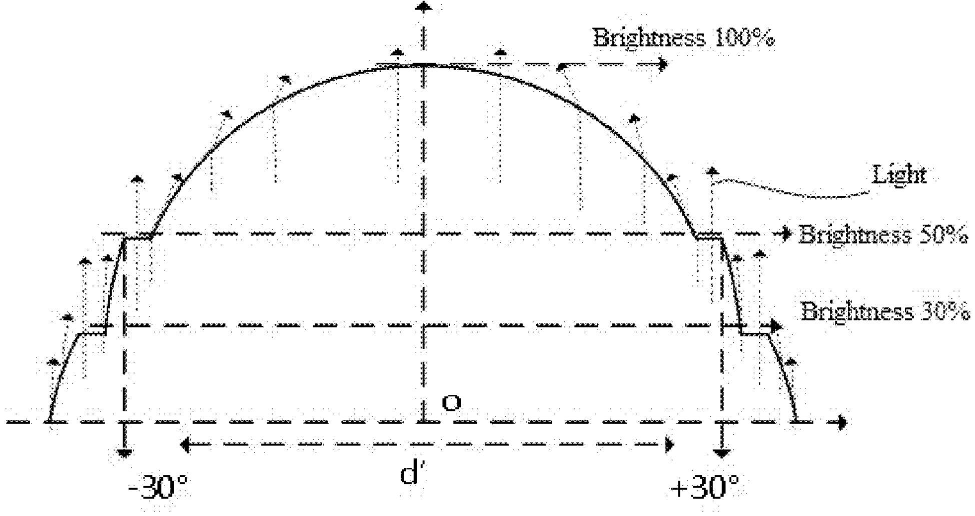
FIG. 7 schematically shows a schematic diagram of light outputting of layers of lens regions according to an embodiment of the present disclosure.

FIG. 7 schematically shows a schematic diagram of light outputting of layers of lens regions according to an embodiment of the present disclosure.

In some embodiments, in a case that M is greater than or equal to 2, layers of lens regions within a same angle range are configured to change a light output direction of a part of the light in sequence from bottom to top of the lens.

With reference to FIG. 7, lens regions of 360° along the circumference of the lens are respectively provided at the position of about 30% brightness and the position of about 50% brightness position. In a process of emitting light from the EL light-emitting layer 110 from the bottom of the lens towards the first direction, the light may be buffered more than one time due to the layers of lens regions, thereby continuously reducing a degree of light convergence to the focus and effectively increasing the brightness viewing angle.

Figure 8:
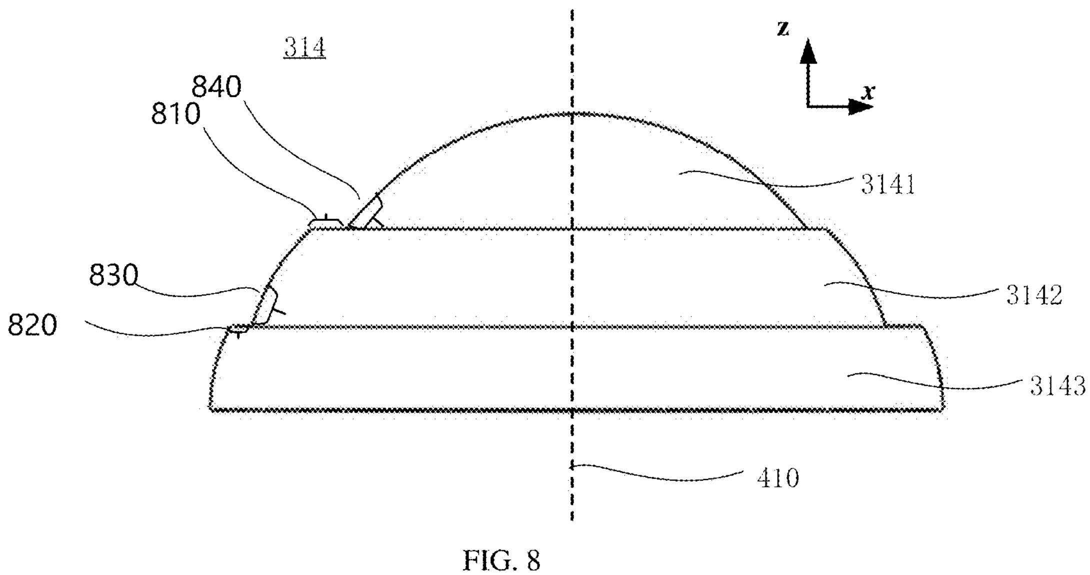
FIG. 8 schematically shows a main view of the lens shown in FIG. 4(*a*) according to an embodiment of the present disclosure.

FIG. 8 schematically shows a main view of the lens shown in FIG. 4(*a*) according to an embodiment of the present disclosure.

In some embodiments, with reference to FIG. 2 to FIG. 8, a top of a top one of the M layers of lens regions (such as the first layer of lens region 3141) includes an arc-shaped surface protruding along the first direction. The top layer of lens region is the lens region closest to a light output side of the lens. That is the structure of each lens may include a convex lens.

In some embodiments, an orthographic projection of at least one of the M layers of lens regions on a first plane includes a line segment. The first plane is parallel to the first direction.

With reference to FIG. 8, a front view of lens D 314 includes line segments projected by each layer of lens region on the left and right sides. As shown in FIG. 8, a top left projection of the second layer of lens region 3142 includes a first line segment 810. A top left projection of the third layer of lens region 3143 includes a second line segment 820. In other words, the first segment 810 or the second segment 820 is the projection of a top side edge of each layer of lens region towards the lens region. That is, the top lens region of the lens is an arc-shaped convex lens region, and the non-top lens region is a trapezoidal like lens region.

In some embodiments, a slope of the line segment is smaller than a slope of a boundary projection line segment. A first end of the boundary projection line segment is connected to the line segment. A second end of the boundary projection line segment is closer to the top of the lens than the first end.

For example, as shown in FIG. 8, a slope of the first line segment 810 is smaller than a slope of a first boundary projection line segment 840. That is, the first line segment 810 is flatter than the first boundary projection line segment 840, so as to realize light buffering and reduce the degree of light convergence towards the focus by changing the light output direction. The slope of the first boundary projection line segment 840 may be determined based on a slope of a tangent at the position where the first end of the first boundary projection line segment 840 is located.

For example, as shown in FIG. 8, a slope of the second line segment 820 is smaller than a slope of a second boundary projection line segment 830. That is, the second line segment 820 is flatter than the second boundary projection line segment 830, so as to realize light buffering and reduce the degree of light convergence towards the focus by changing the light output direction. The slope of the second boundary projection line segment 830 may be determined based on a slope of a tangent at the position where the first end of the second boundary projection line segment 830 is located.

In some embodiments, the first segment 810 or the second segment 820 is a horizontal line segment, with a slope of 0 degree.

Specifically, the present disclosure does not intend to limit that a projection of the top side edge of each layer of lens region is a horizontal line segment. The slope of the top side edge may be adjusted as desired, as long as light buffering may be achieved, for example, a slope of a top side edge of a lower one of adjacent two layers of lens regions is smaller than a slope of an upper one of the two layers of lens region (e.g. a slope determined by α, β or γ).

In some embodiments, each of the M layers of lens regions has a projection length and the projection lengths of the M layers of lens regions gradually increase from bottom to top of the lens. The projection length is a length of a side edge of each layer of lens region in the first plane. The side edge extends from bottom to top of the layer of lens region. The first plane is parallel to the first direction.

As shown in FIG. 4(*a*) and FIG. 8, for example, on a left side of a centerline 410, an arc portion of the first layer of lens region 3141 with a height of d1 is a side edge of the layer of lens region (a line segment between the first line segment 810 and the bottom of the lens). An arc portion of the second layer of lens region 3142 with a height of d2 is a side edge of the layer of lens region (a line segment between the first line segment 810 and the second line segment 820). An arc portion of the third layer of lens region 3143 with a height of d3 is a side edge of the lens region (a line segment between the second line segment 820 and a vertex of the lens). A length of the side edge of each layer of lens region is proportional to a height of each layer of lens region. In a case of d1<d2<d3, the lengths of side edges of layers of lens regions gradually increase, thereby ensuring the light transmitting effect of each layer of lens region at the brightness position of each layer of lens region.

Figure 9A:
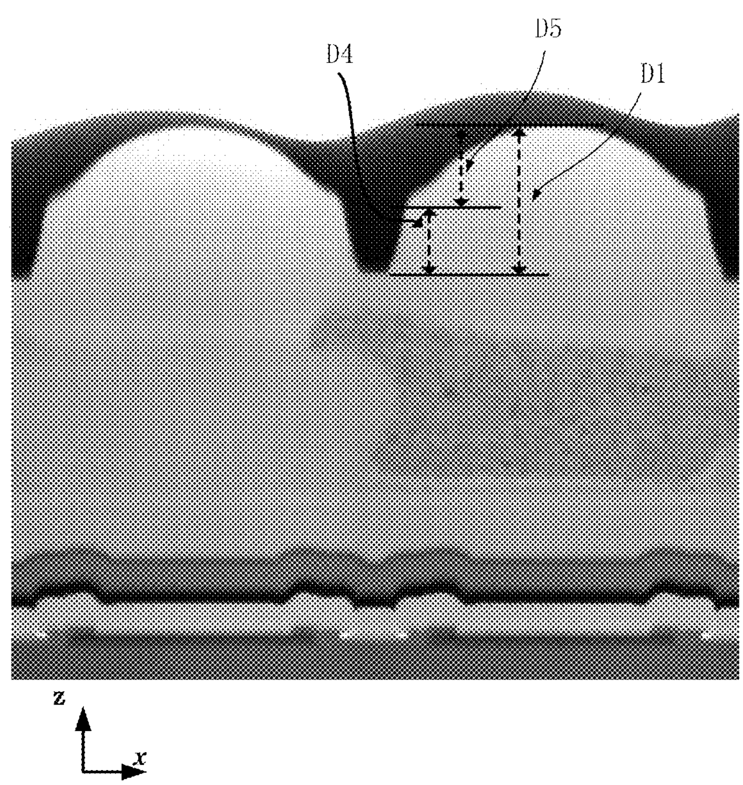
FIG. 9(*a*) schematically shows a physical structure of a lens according to an embodiment of the present disclosure.
Figure 9B:
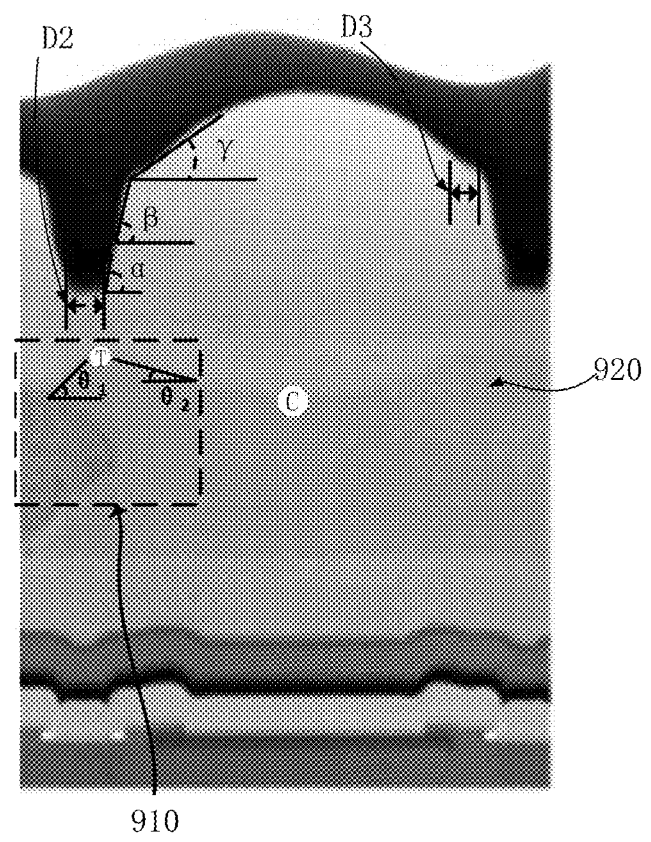
Figure 9C:
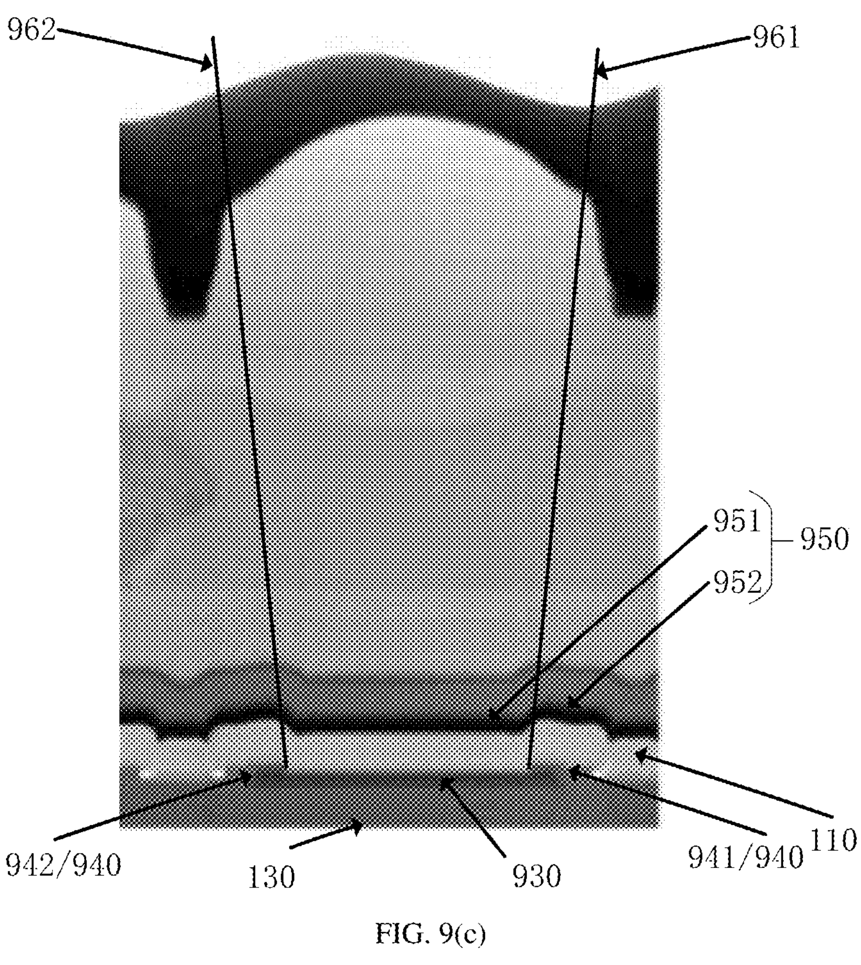

FIG. 9(*a*) schematically shows a physical structure of a lens according to an embodiment of the present disclosure. FIG. 9(*b*) schematically shows a physical structure of a lens according to another embodiment of the present disclosure. FIG. 9(*c*) schematically shows a conical region defined in the physical structure of the lens in FIG. 9(*b*) according to the embodiment of the present disclosure. A unit of distance for the physical structure is nanometers (nm).

As shown in FIG. 9(*a*), in an example, D1 is a total height of the lens (the distance between top and bottom of the lens, in which the bottom of the lens is above a planarization layer in the lens layer). For example, D1=1535.27 nm. In FIG. 9(*a*), a height of the bottom layer of lens region is D4=708.75 nm, and a height of the top layer of lens region is D5=843.36 nm. A height of the lower layer is smaller than a height of the upper layer.

In some embodiments, with reference to FIG. 2 to FIG. 9(*b*), a width of the each lens in a second direction decreases from bottom to top of the lens. The second direction (e.g. x direction in FIG. 8) is perpendicular to the first direction.

According to embodiments of the present disclosure, the design of a structure that gradually shrinks from bottom to top of the lens is beneficial to improve the convergence degree of light and increase the brightness of the display panel.

In some embodiments, for any adjacent two of the M layers of lens regions, a difference between a width of an upper one of the two layers of lens regions and a width of a lower one of the two layers of lens region on a single side of the lens is less than a width of an interval between the lens and an adjacent lens in the second direction.

With reference to FIG. 9(*b*), D3 is a difference between a first layer of lens region and a unilateral width of a second layer of lens region. For example, D3=243.40 mm. In FIG. 9(*b*), the interval width between adjacent lenses (a width at a bottom of the interval) is D2=318.29 nm.

In some embodiments, the display panel further includes a plurality of filters located in a color film layer 170 (such as a red (R) filter 171, a green (G) filter 172 and a blue (B) filter 173). The color film layer 170 includes a plurality of overlapping regions. In at least one overlapping region, an orthographic projection of one of adjacent two filters on the base substrate 130 at least partially overlaps with an orthographic projection of the other one of the adjacent two filters on the base substrate. The display panel further includes a first interval located between two adjacent lenses. An orthographic projection of the first interval on the base substrate 130 at least partially overlaps with an orthographic projection of the at least one overlapping region on the base substrate 130.

With reference to FIG. 9(*b*), for example, if the first interval is the interval corresponding to D2, which corresponds to a first overlapping region 910 in the first direction, an orthographic projection (a projection in a direction perpendicular to the first direction projection) of the first interval on the base substrate 130 intersects with, e.g. overlaps or at least partially overlaps, an orthographic projection of the first overlapping region 910 on the base substrate 130.

In some embodiments, a width of the first interval is smaller than a height of a bottom layer of lens region in the lens adjacent to the first interval. The bottom layer of lens region is the lens region farthest away from a light output side of the lens.

For example, with reference to FIG. 4(*a*) and FIG. 9(*b*), a height d1 of the bottom layer of lens region (the third layer of lens region 3143) corresponding to $\alpha$ may be greater than D2, so that each lens in the lens layer has a larger light transmitting range, and the brightness viewing angle range of each lens may be increased by reducing the width of the interval.

For example, filters are spaced by a black matrix BM (black matrix). The basic function of the black matrix BM is to shield light, improve contrast, avoid color mixing between adjacent color layers, and reduce external light reflection. Light leaking between sub-pixels may be effectively blocked by using BM.

According to embodiments of the present disclosure, the interval between any adjacent two lenses corresponds to an overlapping region in the first direction, so that an orthographic projection of the lens on the base substrate 130 staggers the overlapping region. Since the overlapping region shields light, the light transmitting efficiency of the lens may be effectively improved by staggering the light shielding portion.

In some embodiments, the plurality of overlapping regions include a first overlapping region 910. A first filter 920 has a first slope in the first overlapping region 910. The first slope is a slope from a highest point (e.g. point T in FIG. 9(*b*)) of the first filter in the first overlapping region to an edge of the first filter (e.g. in a direction opposite to point C). A slope of a bottom one of the M layers of lens regions is greater than the first slope. The bottom layer of lens region is the lens region farthest away from a light output side of the lens.

With reference to FIG. 9(*b*), the region from the highest point T (the highest point of the first overlapping region 910) of the first filter 920 to the edge of the filter is an extension of exposure edge, and the slope is very narrow, so that the sharp change in slope forms an inclined angle $\theta_1$. Since $\alpha$ is greater than $\theta_1$, a slope corresponding to $\alpha$ is greater than the first slope corresponding to $\theta_1$.

In some embodiments, a slope of a sub bottom one of the M layers of lens regions is greater than the first slope. The sub bottom layer of lens region is adjacent to the bottom layer of lens region. The slope of the sub bottom layer of lens region is less than the slope of the bottom layer of lens region.

For example, assuming that an inclined angle of the sub bottom layer of lens region is $\beta$, $\alpha>\beta>\theta_1$ is satisfied. This allows the lens to balance the brightness and the viewing angle range of the bottom layer of lens region and its adjacent lens region, and to have an improved light transmitting efficiency.

In some embodiments, the first filter has a second slope in the first overlapping region. The second slope is a slope from the highest point of the first filter to a center of the first filter. In other embodiments, the first slope is greater than the second slope. With reference to FIG. 9(*b*), the region of the first filter 920 from the center point C to the highest point T of the extension of the edge is a uniform adhesive extension region (the highest point of the first overlapping region 910), and has a relatively gentle slope. The gentle change in slope forms an inclined angle $\theta_2$, so that $\theta_1>\theta_2$ i.e. the first slope is greater than the second slope. $\alpha>\beta>\gamma>\theta_2$ is satisfied, so that even the slope is the smallest, it may still balance the brightness and viewing angle range of adjacent lens regions in each layer, and improve the light transmitting efficiency.

In some embodiments, with reference to FIG. 9(*c*), the display panel further includes: an anode 930 disposed on the base substrate 130, where the anode 930 is located on a side of the light-emitting layer 110 close to the base substrate 130; a pixel defining layer 940 disposed on the base substrate 130, where the pixel defining layer 940 is located between the anode 930 and the light-emitting layer 110; and a cathode 950 located on a side of the light-emitting layer 110 away from the base substrate 130. The cathode 950 includes a first cathode portion 951 and a second cathode portion 952. An orthographic projection of the first cathode portion 951 on the base substrate 130 falls within an orthographic projection of the anode 930 on the base substrate 130. The second cathode portion 952 protrudes towards the first direction relative to the first cathode portion 951. The pixel defining layer 940 includes a first side edge 941 and a second side edge 942. An orthographic projection of the first side edge 941 on the base substrate and an orthographic projection of the second side edge 942 on the base substrate 130 both fall within an orthographic projection of an anode 930 of a same sub-pixel on the base substrate 130. The cathode includes a first protrusion edge and a second protrusion edge. The first protrusion edge and the second protrusion edge are located in a transition region between the first cathode portion 951 and the second cathode portion 952. An orthographic projection of the first protrusion edge on the base substrate and an orthographic projection of the second protrusion edge on the base substrate 130 both fall within the orthographic projection of the anode 930 of the same sub-pixel on the base substrate 130. A conical region is defined by a first line 961 between the first side edge and the first protrusion edge, and a second line 962 between the second side edge and the second protrusion edge. It is possible to cause the light-emitting region to be divergent and increase the brightness viewing angle.

In some embodiments, with reference to FIG. 9(*c*), an orthographic projection of the conical region on the base substrate 130 at least partially overlaps with an orthographic projection of a top layer of lens region on the base substrate 130. The top layer of lens region is a lens region closest to a light output side of the lens. This allows most of the light in the central light-emitting region to pass through a curved lens in the top layer of lens region, thereby improving the convergence effect.

Figure 10:
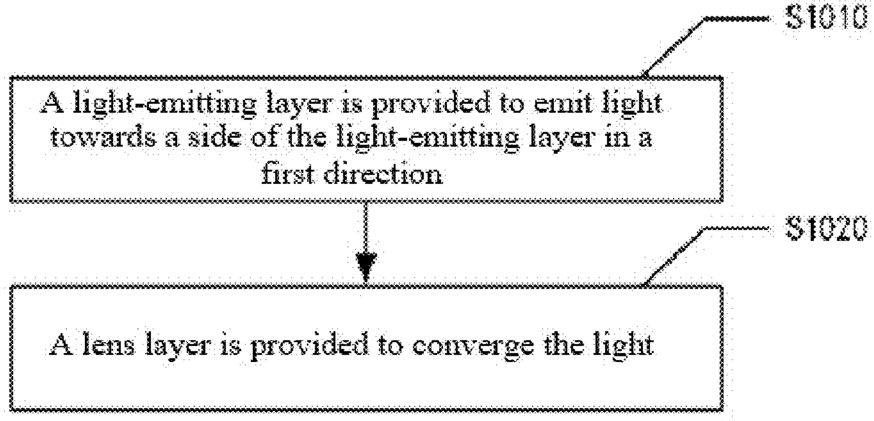
FIG. 10 schematically shows a flowchart of a display method according to an embodiment of the present disclosure.

FIG. 10 schematically shows a flowchart of a display method according to an embodiment of the present disclosure.

In operation S1010, a light-emitting layer is provided to emit light towards a side of the light-emitting layer in a first direction.

In operation S1020, a lens layer is provided to converge the light, where the lens layer (such as the first lens layer 310) is located on the side of the light-emitting layer (such as the EL light-emitting layer 110) in the first direction. The lens layer includes N lenses for converging the light. Each lens has M layers of lens regions arranged in a stepped shape from bottom to top. Each layer of lens region is arranged along a circumference of the lens within a predetermined angle range. Each of the M layers of lens regions has a curvature and the curvatures of the M layers of lens regions gradually increase from bottom to top of the lens, where N and M are greater than or equal to 1.

Figure 11:
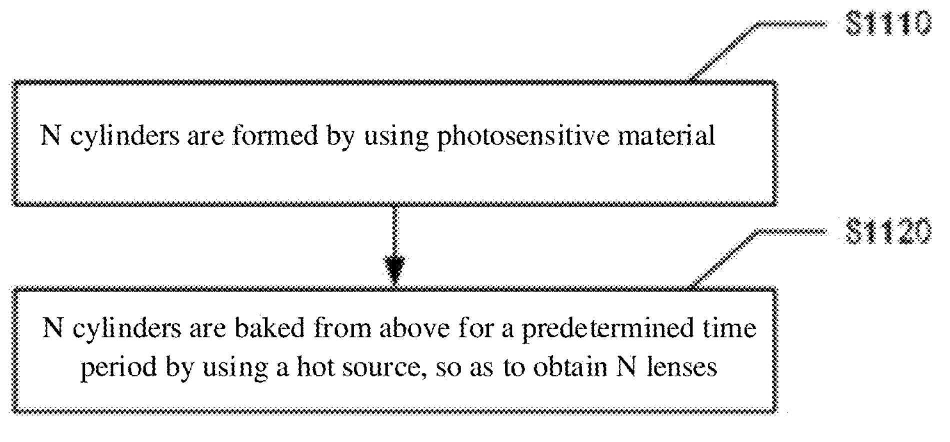
FIG. 11 schematically shows a flowchart of manufacturing a lens according to an embodiment of the present disclosure.

In some embodiments, before providing a lens layer to converge the light, the method further includes manufacturing N lenses, specifically including operations S1110 to S1120 as shown in FIG. 11.

It may be understood that the display method of this embodiment has steps in one to one correspondence with one or more embodiments of the display panel in FIG. 2 to FIG. 9.

Figure 12:
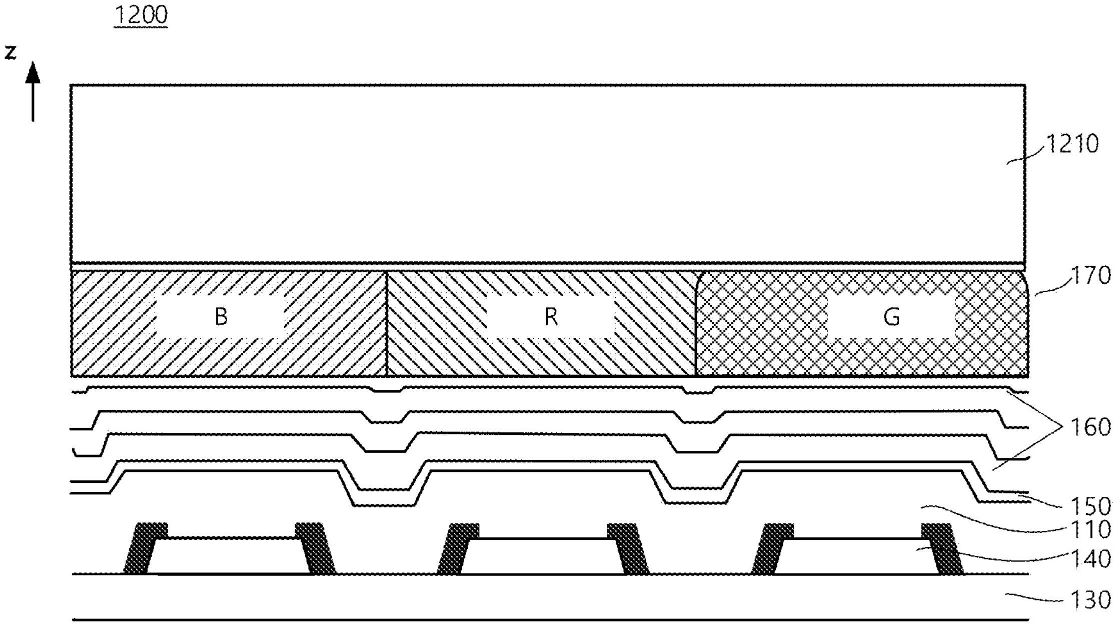
FIG. 12 schematically shows a schematic diagram of coating an entire surface when manufacturing a lens according to an embodiment of the present disclosure.
Figure 13:
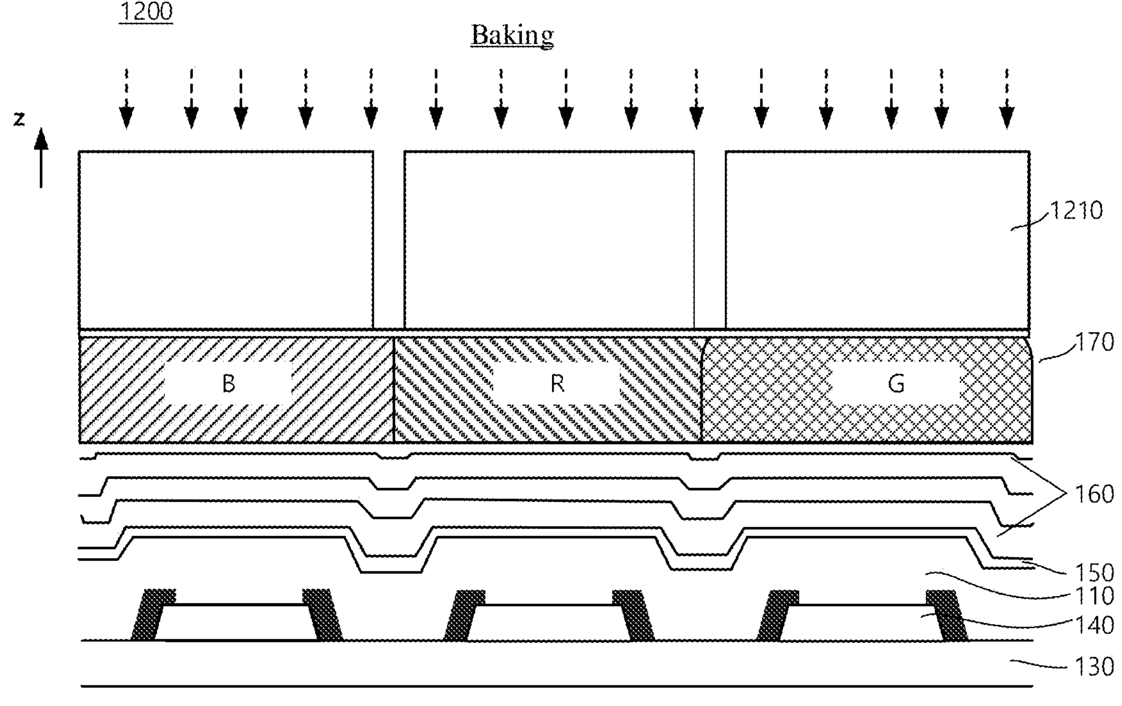
FIG. 13 schematically shows a schematic diagram of a cylinder obtained when manufacturing a lens according to an embodiment of the present disclosure.
Figure 14:
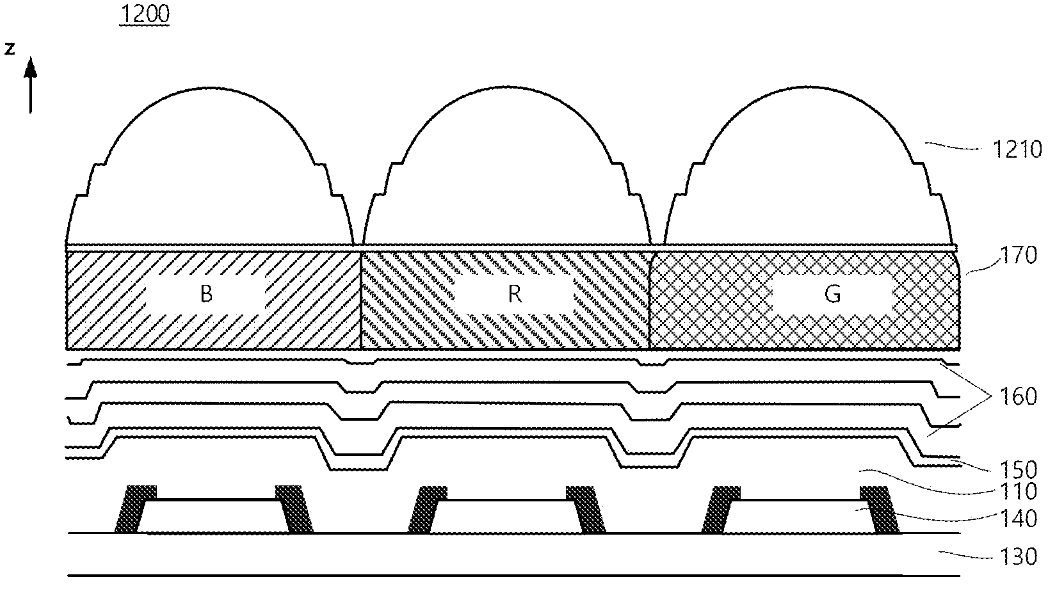
FIG. 14 schematically shows a schematic diagram of a lens manufactured according to an embodiment of the present disclosure.

FIG. 11 schematically shows a flowchart of manufacturing a lens according to an embodiment of the present disclosure. FIG. 12 schematically shows a schematic diagram of coating an entire surface when manufacturing a lens according to an embodiment of the present disclosure. FIG. 13 schematically shows a schematic diagram of a cylinder obtained when manufacturing a lens according to an embodiment of the present disclosure. FIG. 14 schematically shows a schematic diagram of completion of manufacturing a lens according to an embodiment of the present disclosure.

In operation S1110, N cylinders are formed by using photosensitive material.

With reference to FIG. 12 to FIG. 14, a display panel 1200 includes an EL light-emitting layer 110, a third lens layer 1200, a base substrate 130, an anode layer 140, a cathode layer 150, an encapsulation layer 160 and a color film layer 170.

For example, the photosensitive material may include photoresists. First, the photoresist with a certain thickness is coated on the entire surface, such as spray coating, flowing coating, wetting coating, rolling coating, or rotating coating, etc. Then, operations are performed, such as exposing the coating→developing(patterning)→high-temperature baking and forming (100° C. to 110° C., 30 mins to 40 mins), so as to obtain N cylinders in the third lens layer 1210, such as a cylindrical array photoresist structure. It should be noted that a shape of the cylinder is affected by a shape of a mask. The present disclosure does not limit N cylinders to N circular cylinders. For example, the N cylinders may be prisms.

In operation S1120, the N cylinders are baked from above for a predetermined time period by using a hot source, so as to obtain N lenses.

In some embodiments, each cylinder is hot melt for a predetermined time period to form the M layers of lens regions arranged in a stepped shape, so as to obtain a respective lens.

In some embodiments, with reference to FIG. 3, by high-temperature hot melting, the lens pattern is gradually formed from top to bottom (as the upper part is closer to the hot source), so as to form two layers of lens regions. Position(s) at which the lens is segmented may be adjusted by controlling baking time.

In other embodiments, with reference to FIG. 14, layers of lens regions are formed for each lens. For example, when coating the adhesive, layers of different photosensitive materials may be coated on the entire surface. For example, different photosensitive materials have different melting points or different melting speeds at the same temperature, so that with the high temperature baking, layers of photosensitive materials gradually form respective lens regions on a corresponding side of the lens. For another example, a photosensitive material may be coated on the entire surface when coating adhesive, and baked for a first time period, so as to obtain the bottom layer of lens region (the lens region close to the bottom of the lens as shown in FIG. 14). Then, a hot insulation component, such as a temperature insulation cover having N openings is provided on the bottom layer of lens region, with the N openings cover the bottom layers of lens region of the lenses one by one. Then, baking is continued performed for a second time period, during which the photosensitive materials above the temperature insulation cover are gradually melt from top to bottom, so as to form an upper layer of lens region. It may be understood that if each lens has more than two layers of lens region, it continues to use temperature insulation cover for temperature insulation and repeatedly bake above the temperature insulation cover.

According to the display method of embodiments of the present disclosure, on the one hand, the brightness of the display panel may be increased or enlarged by using the lens. On the other hand, it is possible to widen the brightness range of the desired brightness range at one or more brightness positions, thereby increasing the viewing angle range of the product. On yet other hand, with a design of the lens in the stepped shape, a coverage area of at least one layer of lens region is larger as compared with the original circular lens in the related art, so that pixel overlay is larger at the same position, thereby converging more scattered lights at edges of pixels and further increasing brightness.

In other embodiments of the present disclosure, there is further provided a display device including a display panel as shown in FIG. 2 to FIG. 9(*b*) in some embodiments. The display device is a device that may display information such as texts, images or videos. Examples of the display device include a liquid crystal display device (LCD), an organic light-emitting diode display devices (OLED), or a plasma display device, etc.

For example, the display device may be applied to an electronic device. The electronic device according to embodiments of the present disclosure may be a device including display functions, that is, a device that includes the aforementioned display device. For example, the display device may be applied to AR/VR display devices such as a head-mounted display, a stereoscopic display mirror, and a glasses-type display. They may also be used in near-eye devices that replace the optical structure by the digital display, such as an electronic telescope, an electron microscope, a medical endoscope, and other professional devices with requirements of similar near-eye display.

For example, the electronic device may also be a smartphone, a mobile phone, a video phone, an e-book reader, a desktop computers (PC), a laptop, a netbook PC, a personal digital assistant (PDA), a portable multimedia player (PMP), a digital audio player, a mobile medical device, a camera, a wearable device (such as a head-mounted device, an electronic clothing, an electronic bracelet, an electronic necklace, an electronic accessory, an electronic tattoo, or a smart watch), etc.

The electronic device according to embodiments of the present disclosure may also be a smart home appliance that includes a display function. For example, smart home appliances may be televisions, digital video disc (DVD) players, sound systems, refrigerators, air conditioners, vacuum cleaners, ovens, microwaves, washing machines, dryers, air purifiers, set-top boxes, television (TV) boxes, game consoles, electronic dictionaries, electronic keys, camera recorders, electronic photo frames, etc.

According to embodiments of the present disclosure, electronic devices may also be medical devices (such as magnetic resonance angiography (MRA) devices, magnetic resonance imaging (MRI) devices, computed tomography (CT) devices, imaging devices, or ultrasound devices), navigation devices, global positioning system (GPS) receivers, event data recorders (EDRs), flight data recorders (FDRs), automotive information entertainment devices, navigation electronic devices (such as navigation devices, gyroscopes, or compasses), avionics, security devices, industrial or consumer robots, automatic teller machines (ATMs), point of sale (POS), etc.

According to embodiments of the present disclosure, electronic devices may also include furniture with display functions, parts of buildings/structures, electronic bulletin boards, electronic signature receiving devices, projectors, various measurement devices (such as water meters, electricity meters, gas meters, or electromagnetic wave measurement devices), etc. According to some embodiments, electronic devices may be any combination of the aforementioned devices. In addition, electronic devices according to various embodiments may be flexible devices. In addition, it should be apparent to those skilled in the art that electronic devices according to various embodiments of the present disclosure are not limited to the aforementioned devices.

The embodiments of the present disclosure have been described above. However, these embodiments are for illustrative purposes only and are not intended to limit the scope of the present disclosure. Although the various embodiments have been described separately above, this does not mean that the measures in the various embodiments may not be advantageously used in combination. The scope of the present disclosure is defined by the appended claims and their equivalents. Without departing from the scope of the present disclosure, various substitutions and modifications may be made by those skilled in the art, and these substitutions and modifications should all fall within the scope of the present disclosure.

What is claimed is:

1. A display panel, comprising:

a base substrate;

a light-emitting layer disposed on the base substrate and configured to emit light towards a side of the light-emitting layer in a first direction; and a first lens layer disposed on the base substrate and located on the side of the light-emitting layer in the first direction, wherein the first lens layer comprises N lenses for converging the light;

wherein each lens has M layers of lens regions arranged in a stepped shape from bottom to top, each layer of lens region is arranged along a circumference of the lens within a predetermined angle range, each of the M layers of lens regions has a curvature and the curvatures of the M layers of lens regions gradually increase from bottom to top of the lens, where N and M are greater than or equal to 1;

wherein the display panel further comprises a color film layer located between the light-emitting layer and the first lens layer;

wherein the display panel further comprises a plurality of filters located in the color film layer, wherein the color film layer comprises a plurality of overlapping regions, and in at least one overlapping region, an orthographic projection of one of adjacent two filters on the base substrate at least partially overlaps with an orthographic projection of the other one of the adjacent two filters on the base substrate;

wherein the display panel further comprises a first interval located between two adjacent lenses;

wherein an orthographic projection of the first interval on the base substrate at least partially overlaps with an orthographic projection of the at least one overlapping region on the base substrate;

wherein the plurality of overlapping regions comprise a first overlapping region, a first filter has a first slope in the first overlapping region, and the first slope is a slope from a highest point of the first filter in the first overlapping region to an edge of the first filter;

wherein a slope of a bottom one of the M layers of lens regions is greater than the first slope, and the bottom layer of lens region is the lens region farthest away from a light output side of the lens.

2. The display panel of claim 1, wherein each of the M layers of lens regions has a height and the heights of the M layers of lens regions gradually increase from bottom to top of the lens.

3. The display panel of claim 1, wherein each of the M layers of lens regions has a slope and the slopes of the M layers of lens regions gradually decrease from bottom to top of the lens.

4. The display panel of claim 1, wherein each of the M layers of lens regions has a refractive index and the refractive indexes of the M layers of lens regions gradually decrease from bottom to top of the lens.

5. The display panel of claim 4, wherein a difference between refractive indexes of every adjacent two of the M layers of lens regions gradually increases from bottom to top of the lens.

6. The display panel of claim 1, wherein in a case that M is greater than or equal to 2, layers of lens regions within a same angle range are configured to change a light output direction of a part of the light in sequence from bottom to top of the lens.

7. The display panel of claim 1, wherein a width of the first interval is smaller than a height of a bottom layer of lens region in the lens adjacent to the first interval, wherein the bottom layer of lens region is the lens region farthest away from a light output side of the lens.

8. The display panel of claim 1, wherein a slope of a sub bottom one of the M layers of lens regions is greater than the first slope, the sub bottom layer of lens region is adjacent to the bottom layer of lens region, and the slope of the sub bottom layer of lens region is less than the slope of the bottom layer of lens region.

9. The display panel of claim 1, wherein the first filter has a second slope in the first overlapping region, and the second slope is a slope from the highest point of the first filter to a center of the first filter, a slope of each of the M layers of lens regions is greater than the second slope.

10. The display panel of claim 9, wherein the first slope is greater than the second slope.

11. The display panel of claim 1, wherein a top of a top one of the M layers of lens regions comprises an arc-shaped surface protruding along the first direction, and the top layer of lens region is the lens region closest to a light output side of the lens.

12. The display panel of claim 1, wherein a projection of at least one of the M layers of lens regions on a first plane comprises a line segment, and the first plane is parallel to the first direction.

13. The display panel of claim 1, wherein a width of the each lens in a second direction decreases from bottom to top of the lens, and the second direction is perpendicular to the first direction.

14. The display panel of claim 13, wherein for any adjacent two of the M layers of lens regions, in the second direction, a difference between a width of an upper one of the two layers of lens regions and a width of a lower one of the two layers of lens region on a single side of the lens is less than a width of an interval between the lens and an adjacent lens.

15. The display panel of claim 1, wherein:

the each lens comprises a micro lens, and the N lenses are configured to form a micro lens array; and/or the display panel comprises a micro-display panel.

16. The display panel of claim 1, wherein the display panel further comprises:

an anode disposed on the base substrate, wherein the anode is located on a side of the light-emitting layer close to the base substrate;

a pixel defining layer disposed on the base substrate, wherein the pixel defining layer is located between the anode and the light-emitting layer; and a cathode disposed on the base substrate, wherein the cathode is located on a side of the light-emitting layer away from the base substrate, wherein:

the cathode comprises a first cathode portion and a second cathode portion, an orthographic projection of the first cathode portion on the base substrate falls within an orthographic projection of the anode on the base substrate, and the second cathode portion protrudes towards the first direction relative to the first cathode portion, the pixel defining layer comprises a first side edge and a second side edge, and an orthographic projection of the first side edge on the base substrate and an orthographic projection of the second side edge on the base substrate both fall within an orthographic projection of an anode of a same sub-pixel on the base substrate, the cathode comprises a first protrusion edge and a second protrusion edge, the first protrusion edge and the second protrusion edge are located in a transition region between the first cathode portion and the second cathode portion, and an orthographic projection of the first protrusion edge on the base substrate and an orthographic projection of the second protrusion edge on the base substrate both fall within the orthographic projection of the anode of the same sub-pixel on the base substrate, a conical region is defined by a first line between the first side edge and the first protrusion edge, and a second line between the second side edge and the second protrusion edge;

an orthographic projection of the conical region on the base substrate at least partially overlaps with an orthographic projection of a top layer of lens region on the base substrate, and the top layer of lens region is a lens region closest to a light output side of the lens.

17. The display panel of claim 1, wherein each of the M layers of lens regions has a projection length and the projection lengths of the M layers of lens regions gradually increase from bottom to top of the lens, the projection length is a length of a side edge of each layer of lens region in a first plane, the side edge extends from bottom to top of the layer of lens region, and the first plane is parallel to the first direction.

18. A display device comprising a display panel of claim 1.

* * * * *